United States Patent
Chia et al.

(10) Patent No.: US 7,705,446 B2
(45) Date of Patent: Apr. 27, 2010

(54) PACKAGE STRUCTURE HAVING SEMICONDUCTOR CHIP EMBEDDED THEREIN AND METHOD FOR FABRICATING THE SAME

(75) Inventors: Kan-Jung Chia, Hsinchu (TW); Shih-Ping Hsu, Hsinchu (TW)

(73) Assignee: Phoenix Precision Technology Corporation (TW)

( * ) Notice: Subject to any disclaimer, the term of this patent is extended or adjusted under 35 U.S.C. 154(b) by 406 days.

(21) Appl. No.: 11/782,356

(22) Filed: Jul. 24, 2007

(65) Prior Publication Data

US 2008/0023819 A1 Jan. 31, 2008

(30) Foreign Application Priority Data

Jul. 25, 2006 (TW) .............. 95127100 A

(51) Int. Cl.
*H01L 23/06* (2006.01)
*H01L 23/10* (2006.01)

(52) U.S. Cl. .............. 257/703; 257/778; 257/780; 257/E23.182

(58) Field of Classification Search .......... 257/703, 257/778, 783, E23.182
See application file for complete search history.

(56) References Cited

U.S. PATENT DOCUMENTS

| | | | | |
|---|---|---|---|---|
| 5,565,706 A * | 10/1996 | Miura et al. | ............. | 257/723 |
| 6,506,632 B1 * | 1/2003 | Cheng et al. | ............. | 438/126 |
| 6,800,941 B2 * | 10/2004 | Lee et al. | ............. | 257/773 |
| 6,849,935 B2 * | 2/2005 | Palanisamy | ............. | 257/678 |
| 6,919,508 B2 * | 7/2005 | Forcier | ............. | 174/565 |
| 7,400,035 B2 * | 7/2008 | Abe et al. | ............. | 257/700 |
| 2003/0124767 A1 * | 7/2003 | Lee et al. | ............. | 438/107 |
| 2003/0136577 A1 * | 7/2003 | Abe | ............. | 174/255 |
| 2003/0227095 A1 * | 12/2003 | Fujisawa et al. | ............. | 257/782 |
| 2005/0230797 A1 * | 10/2005 | Ho et al. | ............. | 257/678 |

* cited by examiner

*Primary Examiner*—Nitin Parekh
(74) *Attorney, Agent, or Firm*—Lowe Hauptman Ham & Berner, LLP

(57) ABSTRACT

A package structure having a semiconductor chip embedded therein and a method of fabricating the same are disclosed. The package structure comprises: an aluminum oxide composite plate and a semiconductor chip. The aluminum oxide composite plate is formed by a stack consisting of an adhesive layer placed in between two aluminum oxide layers. The semiconductor chip having an active surface a plurality of electrode pads disposed thereon can be embedded and secured in the aluminum oxide composite plate. The present invention also comprises a method of fabricating the above-mentioned package structure. The present invention provides an excellent package structure, which can decrease the thickness of the package structure and make the package structure having characteristics of high rigidity and enduring tenacity at the same time.

7 Claims, 4 Drawing Sheets

PACKAGE STRUCTURE HAVING SEMICONDUCTOR CHIP EMBEDDED THEREIN AND METHOD FOR FABRICATING THE SAME

BACKGROUND OF THE INVENTION

1. Field of the Invention

The present invention relates to a package structure having a semiconductor chip embedded therein and a method for fabricating the same and, more particularly, to a package structure having characteristics of low thickness, high rigidity and enduring tenacity with a semiconductor chip embedded therein and method for fabricating the same.

2. Description of Related Art

Customer demands of the electronics industry continue to evolve rapidly and the main trends are high integration and miniaturization. In order to satisfy those requirements, especially in the packaging of semiconductor devices, development of circuit boards with the maximum of active and passive components and conductive wires has progressed from single to multiple layer types. This means that a greater usable area is available due to interlayer connection technology.

First, semiconductor chip carriers suitable for semiconductor devices are manufactured through a common semiconductor chip carrier manufacturer. Then, the semiconductor chip carrier is processed by semiconductor chip attachment, wire bonding, molding, and implanting solder ball etc. for assembling semiconductor devices. Finally, the semiconductor devices having electronic functions required by clients are completed. Because the steps of the practical manufacture are minute and complex, interfaces are not integrated easily at the time when manufactured by different fabricating proprietors. Further, if the client wants to change the design of the function, efficiency and economic benefit suffer.

In the conventional semiconductor device structure, semiconductor chips are mounted on top of a substrate, and then processed in wire bonding, or connected the chip which having the solder bump thereon to the conductive pads on the substrate, followed by placing solder balls on the back of the substrate to provide electrical connections for printed circuit board. Although an objective of high quantity pin counts is achieved, this condition is limited by way of long pathways of conductive lines making electric characteristics unable to be improved in the more frequent and high-speed operating situations. Otherwise, the complexity of the manufacture is relatively increased because too many connective interfaces are required for conventional packages.

In many studies, semiconductor chips directly conducting to external electronic devices are embedded into a package substrate to shorten conductive pathways, decrease signal loss and distortion, and increase abilities of high-speed operation.

In a carrier having a semiconductor chip embedded therein, for preventing destruction of the chip in carrier by laser drilling, as shown in FIG. 1, metal layers are added on electrode pads of an active surface of the semiconductor chip. The structure of the carrier having a semiconductor chip embedded therein includes: a carrier 11, in which a cavity is formed; a semiconductor chip 12 which is set in the cavity, and a plurality of electrode pads 13 formed on an active surface of the semiconductor chip 12; a protective layer 14 formed on the carrier 11 having the semiconductor chip 12 embedded therein, and then the a plurality of electrode pads 13 are exposed; a plurality of metal layer 15 formed on surfaces of the electrode pads 13; and a build-up structure 16 formed on surfaces of the semiconductor chip 12 and the carrier 11. The build-up structure 16 is formed on the surfaces of the semiconductor chip 12 and the carrier 11, and conducts the electrode pads 13 of the semiconductor chip 12.

Currently, in a package structure having the semiconductor chip embedded therein, stress between the build-up structure and the non-build-up structures is not the same. Because the build-up structure is asymmetric, the metal carrier becomes warp. Under this condition, production becomes complex, and excessively warped carriers cause low yield and low stability of products.

Therefore, in order to prevent semiconductor chip-embedded carriers becoming warp due to an asymmetric build-up structure and to improve the yield of the process, carriers made of copper or bismaleimide-triazine (BT) resin already have not satisfy needs of the utilization.

SUMMARY OF THE INVENTION

In view of the above conventional shortcomings, the present invention provides a package structure having a semiconductor chip embedded therein, and comprising an aluminum oxide composite plate and at least one build-up structure. The aluminum oxide composite plate is composed of an adhesive layer placing between two aluminum oxide plates, and a cavity extending through the upper and lower surface of the aluminum oxide composite plate. The semiconductor chip is embedded and secured in the cavity of the aluminum oxide composite plate and has an active surface with a plurality of electrode pads set thereon. The build-up structure placed on a surface of the aluminum oxide composite plate being the same lateral side as the active surface of the semiconductor chip. The build-up structure comprises a dielectric layer, a plurality of circuit layers on the dielectric layer, and forming a plurality of conductive structures in the dielectric layer to conduct the electrode pads of the semiconductor chip to outside electronic devices.

In the package structure of the present invention, in order to secure the semiconductor chip inside the aluminum oxide composite plate, gaps between the semiconductor chip and the cavity in the aluminum oxide composite plate are filled either with epoxy resin. Or through laminating a dielectric layer on a surface of the aluminum oxide composite plate being the same lateral side as the active surface of the semiconductor chip, part of the dielectric layer fills into gaps between the semiconductor chip and the cavity in the aluminum oxide composite plate in order to secure the semiconductor chip inside the aluminum oxide composite plate.

In the package structure of the present invention, material of the dielectric layer laminated on the surface of the aluminum oxide composite plate being the same lateral side as the active surface of the semiconductor chip, is any one selected from a group consisting of Ajinomoto Build-up Film™ (ABF), bismaleimide triazine (BT), benzocyclobutene (BCB), liquid crystal polymer, polyimide (PI), poly(phenylene ether), poly(tetra-fluoroethylene), aramide, epoxy resin, and fiber glass. Preferably, the dielectric layer is composed of ABF.

In the package structure of the present invention, the conductive structure of the build-up structure is conductive via, and the circuit layers and conductive structures of build-up structure can be made of copper, tin, nickel, chromium, palladium, titanium, tin/lead, or alloy thereof. Preferably, the circuit layers and conductive structures can be made of copper. Besides, a plurality of conductive pads are set on a surface of the build-up structure. Further, a patterned solder mask layer is set on the surface of the build-up structure, and to expose the most outer circuit layer for setting the conductive pads. On the conductive pads, solder bumps are set, and can be made of any one of the group consisting of copper, tin, lead, silver, nickel, gold, platinum, or alloy thereof. Preferably, the solder bumps are composed of tin.

In the package structure of the present invention, the adhesive layer placing between two aluminum oxide plates can be made of any material able to adhere the two aluminum oxide layers, which is neither softened nor decomposed under heating. Preferably, the adhesive layer can be composed of thermosetting resin, e.g. epoxy resin or phenolic-aldehyde resin.

In the package structure of the present invention, the electrode pads on the active surface of the semiconductor chip have a function of conducting the semiconductor chip to outside electronic devices, and then the semiconductor chip can function. Therefore, the electrode pads can be made of any material which has an electrically conductive characteristic, but preferably is composed of copper or aluminum.

According to the above-mentioned package structure having a semiconductor chip embedded therein in the present invention, a method for fabricating the same can comprise the following steps, but is not limited thereto.

Therefore, the present invention further provides a method for fabricating a package structure having a semiconductor chip embedded therein comprising the following steps: first, providing two aluminum plates; second, oxidizing one surface of each aluminum plate and then the two aluminum plates both having an aluminum oxide layer and an aluminum layer; then arranging the aluminum oxide layers of the two aluminum plate to face to each other, and an adhesive layer being placed between the two aluminum plate; subsequently removing the aluminum layers of the two aluminum plates, and forming an aluminum oxide composite plate; forming a cavity in the aluminum oxide composite plate extending through upper and lower surface of the aluminum oxide composite plate, and embedding a semiconductor chip secured into the cavity, wherein a plurality of electrode pads are disposed on an active surface of the semiconductor chip, and finally, forming at least one build-up structure placed on a surface of the aluminum oxide composite plate being the same lateral side as the active surface of the semiconductor chip, wherein the build-up structure comprises a dielectric layer, a plurality of circuit layers on the dielectric layer, and forming a plurality of conductive structures in the dielectric layer to conduct the electrode pads of the semiconductor chip to outside electronic devices.

In the method of the present invention, the semiconductor chip is secured either by way of dropping or pouring glue, or through laminating a dielectric layer into gaps between the semiconductor chip and the cavity to secure the semiconductor chip.

The method in the present invention comprises a step of forming a build-up structure placed on a surface of the aluminum oxide composite plate being the same lateral side as the active surface of the semiconductor chip. The build-up structure can exceed one if it is necessary. The build-up structure has a plurality of conductive structures, and conductive structures can conduct the electrode pads of the semiconductor chip to outside electronic devices, or conduct one circuit layer to another in the build-up structure. Generally, the conductive structures are conductive vias.

The method in the present invention further comprises a step of forming a patterned solder mask layer on the outside surface of the build-up structure. On the patterned solder mask layer, a plurality of openings are formed to expose the circuit layers for setting the electrically conductive pads thereon.

The method in the present invention further comprises a step of forming a plurality of solder bumps on the electrically conductive pads of the build-up structure through electroplating or printing.

In the method of the present invention, the aluminum oxide layers are formed on one lateral of the aluminum plates through any method, but preferably by anodic oxidation.

In the method of the present invention, the aluminum layers of the two aluminum plates can be removed by etching.

Before embedding the semiconductor chip in the cavity of the aluminum oxide composite plate in the present invention, a release film is adhered on a surface of the aluminum oxide composite plate being the same lateral side as a non-active surface of the semiconductor chip and removed after the semiconductor chip is secured. After the semiconductor chip is secured onto the aluminum oxide composite plate, the release film is removed. Material of the release film is not limited, but preferably is any material of temporarily securing the semiconductor chip.

Therefore, the package structure having the semiconductor chip embedded therein and the method for fabricating the same in the present invention solves the problem of the plate warp causing by unequal stress of asymmetric build-up structures. The composite plate of the package structure has a characteristic of high rigidity, and can restrain the unequal stress of the asymmetric build-up structures so as to prevent occurrence of the plate warp. The surface of the aluminum plate is oxidized to form an aluminum oxide layer (ceramics) thereon through oxidation, e.g. anodic oxidation, and an adhesive layer is adhered tightly between the two aluminum oxide layers. Forming the aluminum oxide composite plate of the present invention needs no other additional step, e.g. no sintering is required. The technology and fabrication of the aluminum oxide composite plate of the present invention are simple, and thus mass production is particularly enabled.

Other objects, advantages, and novel features of the invention will become more apparent from the following detailed description when taken in conjunction with the accompanying drawings.

BRIEF DESCRIPTION OF THE DRAWINGS

FIGS. 2F' to 2G' are cross-sectional views showing the embodiment of a method for fabricating a package structure having a chip embedded therein of adding a build-up structure and solder bumps of a package structure.

DETAILED DESCRIPTION OF THE PREFERRED EMBODIMENT

Figure 1:
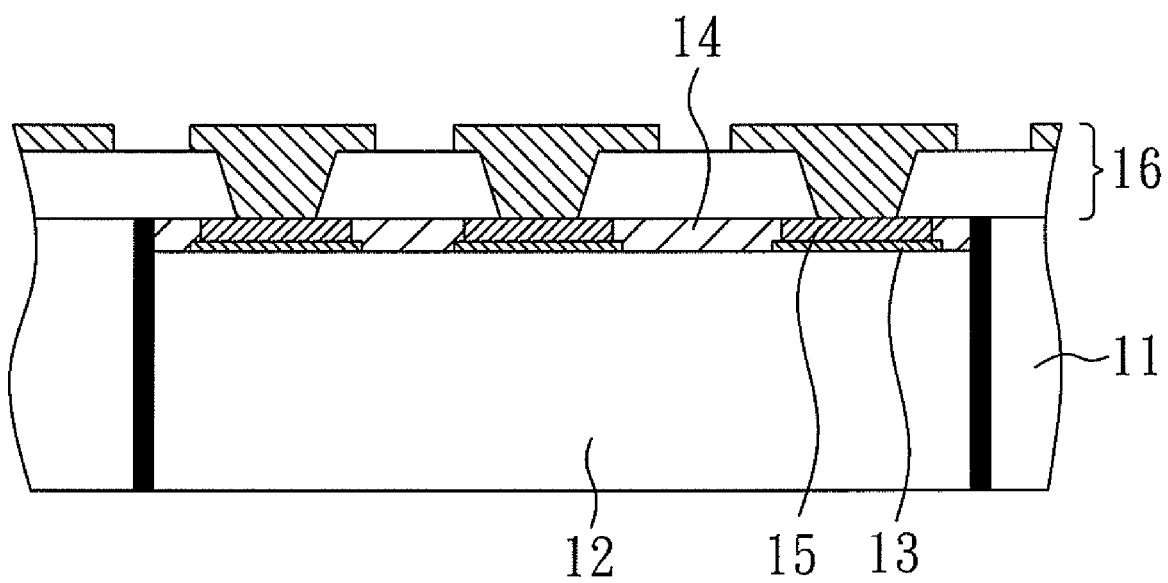
FIG. 1 is a perspective view of a conventional carrier having a semiconductor chip embedded therein.

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements revealed in the drawings are not necessarily aspects of the practice, and quantity and shape thereof are optionally designed. Further, the design aspect of the elements can be more complex.

Embodiment 1

With reference to FIGS. 2A to 2E, there is shown a perspective view of fabricating a package structure having a semiconductor chip embedded therein in the present invention.

Figure 2A:
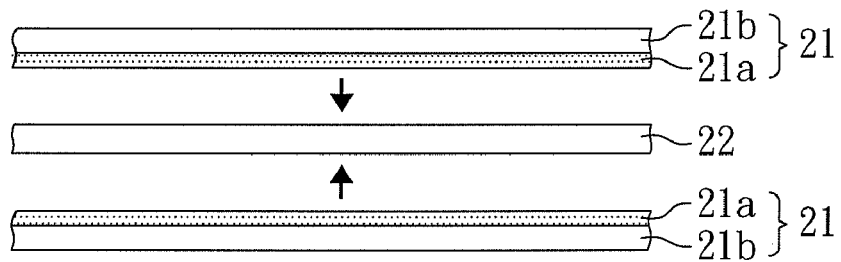
FIGS. 2A to 2G are cross-sectional views showing the embodiment of a method for fabricating a package structure having a chip embedded therein of the present invention.
Figure 2B:
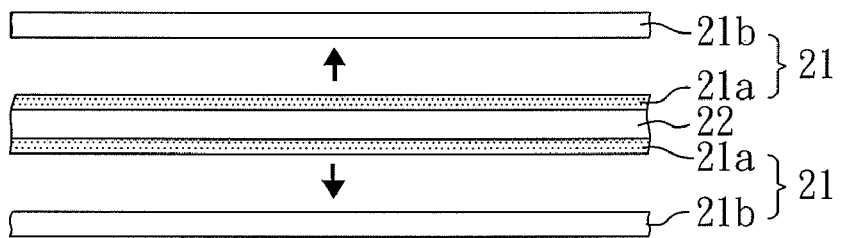
Figure 2C:
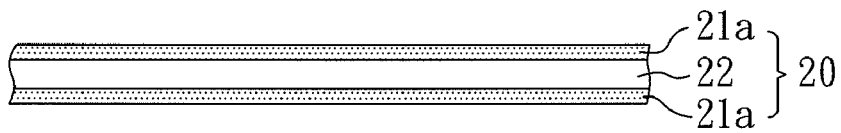

As shown in FIG. 2A, two aluminum plates 21 are provided first. The two aluminum plates 21 are put into an electrolytic tank to proceed with anodic oxidation. Therefore, one surface of the aluminum plate 21 is oxidized to form an aluminum oxide layer 21a, and the other surface of the aluminum plate 21 remains as an aluminum layer 21b. In the present embodiment, the thickness of the aluminum oxide layer 21a is controlled by duration of anodic oxidation. Subsequently, as shown in FIG. 2B, the aluminum oxide layers 21a of the two aluminum plates 21 face each other, and an adhesive layer 22 is tightly placed therebetween. The material of the adhesive layer 22 can be thermosetting resin, and in the present embodiment, the adhesive layer 22 is made of epoxy resin. Then, the respective aluminum layers 21b of the two aluminum plates 21 are removed by etching, and an aluminum oxide composite plate 20 is obtained, as shown in FIG. 2C. The structure of the aluminum oxide composite plate 20 is a sandwich structure of the two aluminum oxide layers 21b and the adhesive layer 22.

Figure 2D:
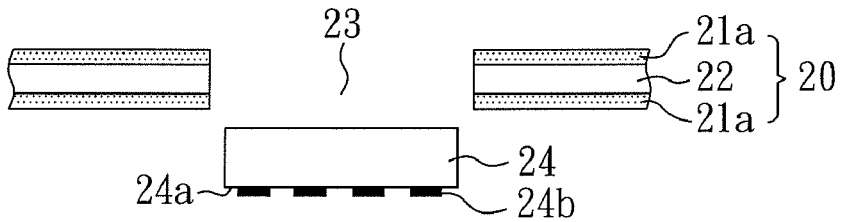

As shown in FIG. 2D, a cavity 23 is formed in the aluminum oxide composite plate 20 generally through chemical etching, and the cavity 23 extending through the upper and lower surface of the aluminum oxide composite plate 20. A semiconductor chip 24, which is cut and formed by wafer integrated circuit processes, is embedded in the cavity 23 of the aluminum oxide composite plate 20. The semiconductor chip 24 has an active surface 24a. A plurality of electrode pads 24b are disposed on the active surface 24a of the semiconductor chip 24, and is made of copper. At the same time, a release film or an adhesive tape (not shown in figures) is adhered on a surface of the aluminum oxide composite plate 20 being the same lateral side as a non-active surface 24c of the semiconductor chip 24, and then the semiconductor chip is embedded in the cavity 23.

Figure 2E:
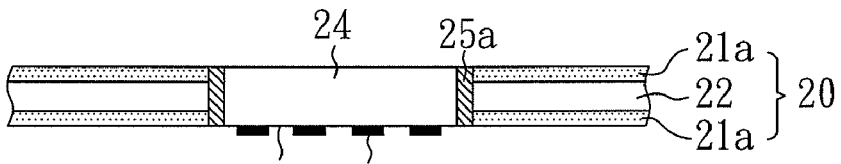

Subsequently, as shown in FIG. 2E, dropping adhesive material 25a thereinto fills gaps between the cavity 23 and the chip 24, and the semiconductor chip 24 is thus secured in the cavity 23 of the aluminum oxide composite plate 20. The adhesive material 25a can be epoxy resin. Then, the release film (not shown in figures) on the surface of the aluminum oxide composite plate 20 is removed. Finally, the package structure having the semiconductor chip embedded therein in the present invention is obtained.

Figure 2F:
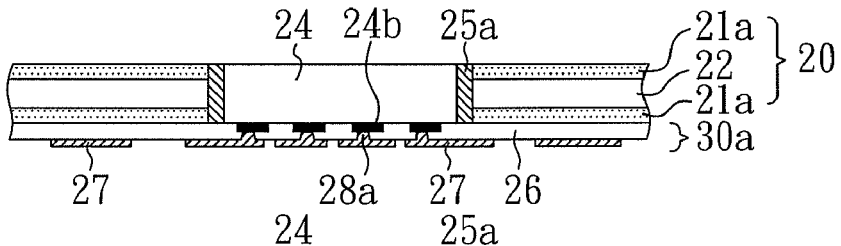

With reference to FIG. 2F and FIG. 2F', a dielectric layer 26 is laminated on another surface of the aluminum oxide composite plate 20 being the same lateral side as the active surface 24a of the semiconductor chip 24. On the dielectric layer 26, a plurality of circuit layers 27 and conductive structures 28a (shown in FIG. 2F) or conductive structures 28b (shown in FIG. 2F') are formed to be a build-up structure 30a (shown in FIG. 2F) or a build-up structure 30b (shown in FIG. 2F'). At the same time, the electrode pads 24b of the semiconductor chip 24 are conducted to the circuit layers 27 by the conductive structures 28a (shown in FIG. 2F) or the conductive structures 28b (shown in FIG. 2F'). In the present embodiment, the non-active surface 24c is exposed advantageously for cooling the semiconductor chip 24.

Figure 2G:
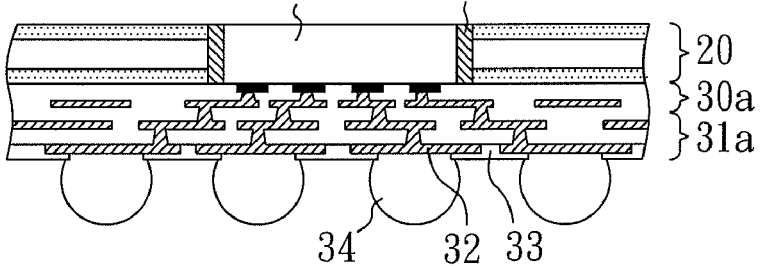
Figure 2F:
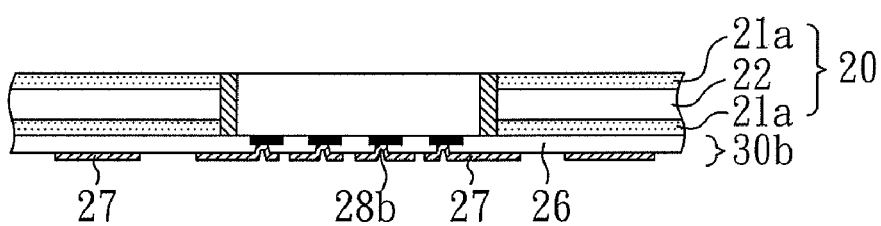
Figure 2G:
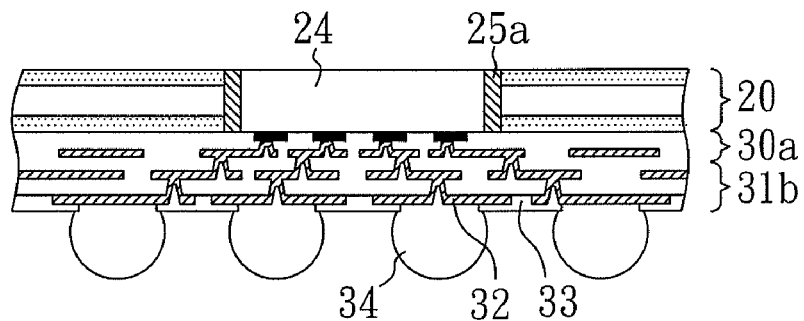

As shown in FIG. 2G, other build-up structures 31a are formed on the dielectric layer 26 through build-up technology if it is necessary. A patterned solder mask layer 33 is formed on an outside surface of the build-up structures 31a, and the circuit layers for disposing electrically conductive pads 32 are exposed through the patterned solder mask layer 33. Material of the patterned solder mask layer 33 can be photo-image insulating material. Finally, solder bumps 34 corresponding to the electrically conductive pads 32 are formed by electroplating or printing. Material of the solder bumps 34 can be any one of the group consisting of copper, tin, lead, silver, nickel, gold, platinum, and alloy thereof.

Therefore, the package structure having the semiconductor chip embedded therein in the present invention, as shown in FIGS. 2F and 2G, includes the aluminum oxide composite plate 20 and the semiconductor chip 24. The aluminum oxide composite plate 20 is composed of the adhesive layer 22 placed between the two aluminum oxide layers 21a. The semiconductor chip 24 is embedded and secured in the cavity 23 of the aluminum oxide composite plate 20, and has the active surface 24a on which the a plurality of electrode pads 24b are disposed. At least one build-up structure 30a is formed on a surface of the aluminum oxide composite plate 20 being the same lateral side as the active surface 24a of the semiconductor chip 24, the build-up structure 30a comprises a dielectric layer 26, a plurality of circuit layers 27 on the dielectric layer 26, and forming a plurality of conductive structures 28a in the dielectric layer 26 to conduct the circuit layers 27.

As shown in FIG. 2G', a package structure having the semiconductor chip 24 embedded in the aluminum oxide composite plate 20 with another build-up structure 31b can also be obtained.

Therefore, the package structure having the semiconductor chip embedded therein in the present invention, as shown in FIG. 2E, includes the aluminum oxide composite plate 20 and the semiconductor chip 24. The aluminum oxide composite plate 20 is composed of the adhesive layer 22 placed between the two aluminum oxide layers 21a, and forming a cavity 23 in the aluminum oxide composite plate 20 extending through upper and lower surface of the aluminum oxide composite plate. The semiconductor chip 24 is embedded and secured in the cavity 23 of the aluminum oxide composite plate 20, and has the active surface 24a on which the a plurality of electrode pads 24b is disposed.

Embodiment 2

The method for fabricating a package structure having a semiconductor chip embedded therein in the present embodiment is very similar to Embodiment 1. Except for a step of securing a semiconductor chip 24 into an aluminum oxide composite plate being different from Embodiment 1, all other aspects are approximately the same as those of Embodiment 1.

Figure 3:
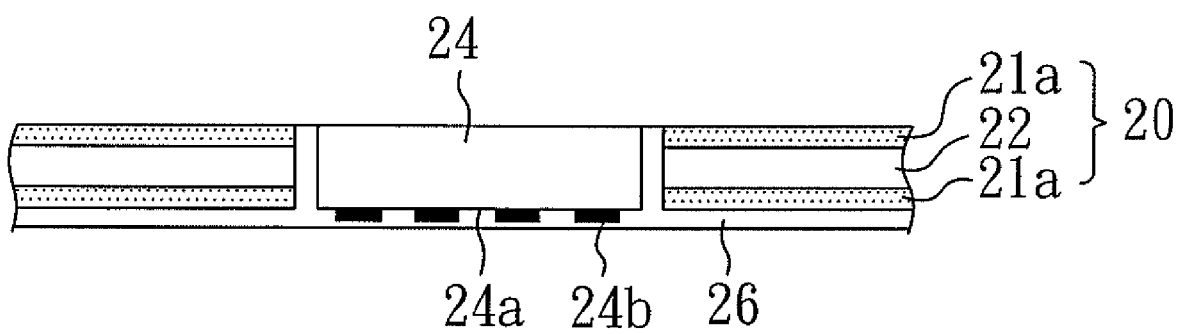
FIG. 3 is a perspective view of an aluminum oxide composite plate having a semiconductor chip secured therein in another preferable embodiment of the present invention.

As shown in FIG. 3, the semiconductor chip 24 is secured in an aluminum oxide composite plate 20. When the semiconductor chip 24 is embedded in the aluminum oxide composite plate 20, epoxy resin is not utilized, but a dielectric layer 26 (e.g. ABF) is laminated into gaps between the semiconductor chip 24 and a cavity 23 of the aluminum oxide composite plate 20. The dielectric layer 26 functions as the adhesive material. Other steps are similar to the steps of Embodiment 1. Finally, the package structure having the semiconductor chip embedded therein is obtained.

Although the present invention has been explained in relation to its preferred embodiment, it is to be understood that many other possible modifications and variations can be made without departing from the scope of the invention as hereinafter claimed.

The invention claimed is:

1. A package structure having a semiconductor chip embedded therein, comprising:
    an aluminum oxide composite plate composed of an adhesive layer placed between and adjacent between two aluminum oxide plates, and a cavity formed and extending through an upper and a lower surface of the aluminum oxide composite plate;
    a semiconductor chip embedded and secured by an adhesive material in the cavity of the aluminum oxide composite plate, wherein the semiconductor chip has an active surface with a plurality of electrode pads set thereon; and
    at least one build-up structure placed directly on a surface of the aluminum oxide plate of the composite plate being the same lateral side as the active surface of the semiconductor chip, the build-up structure comprising a dielectric layer, a plurality of circuit layers on the dielectric layer, and a plurality of conductive structures in the dielectric layer to electrically interconnect the circuit layers to the electrode pads.

2. The package structure having a semiconductor chip embedded therein as claimed in claim 1, wherein the adhesive material is utilized to secure the semiconductor chip in the cavity of the aluminum oxide composite plate is an epoxy resin.

3. The package structure having a semiconductor chip embedded therein as claimed in claim 1, wherein material of the dielectric layer is any one selected from a group consisting of, bismaleimide triazine (BT), benzocyclobutene (BCB), liquid crystal polymer, polyimide (P1), poly(phenylene ether), poly(tetra-fluoroethylene), aramide, epoxy resin, and fiber glass.

4. The package structure having a semiconductor chip embedded therein as claimed in claim 1, wherein the circuit layers and the conductive structures are made of copper, tin, nickel, chromium, palladium, titanium, tinllead, or alloy thereof.

5. The package structure having a semiconductor chip embedded therein as claimed in claim 1, wherein the build-up structure further comprises a plurality of solder bumps on a surface thereof.

6. The package structure having a semiconductor chip embedded therein as claimed in claim 1, wherein the adhesive layer is made of a thermosetting resin.

7. The package structure having a semiconductor chip embedded therein as claimed in claim 1, wherein the electrode pads are is composed of copper or aluminum.

* * * * *